(12) United States Patent
Frick

(10) Patent No.: US 8,766,830 B2
(45) Date of Patent: Jul. 1, 2014

(54) DIGITAL WAVEFORM SYNTHESIZER FOR NMR PHASE CONTROL

(75) Inventor: Eric A. Frick, Mountain View, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 666 days.

(21) Appl. No.: 12/770,547

(22) Filed: Apr. 29, 2010

(65) Prior Publication Data

US 2011/0267056 A1 Nov. 3, 2011

(51) Int. Cl.
*H03M 7/40* (2006.01)

(52) U.S. Cl.
USPC .................... 341/64; 341/50; 341/51

(58) Field of Classification Search
CPC .................................. G01R 33/3607
USPC ........ 341/64, 50, 51; 375/135; 455/76, 165.1, 455/255, 260
See application file for complete search history.

(56) References Cited

U.S. PATENT DOCUMENTS

| 5,343,168 | A | * | 8/1994 | Guthrie ........................ 331/16 |
| 5,353,311 | A | * | 10/1994 | Hirata et al. ................... 375/135 |
| 6,100,830 | A | | 8/2000 | Dedic |
| 6,163,283 | A | | 12/2000 | Schofield |
| 6,236,346 | B1 | | 5/2001 | Schofield et al. |
| 6,320,527 | B1 | | 11/2001 | Dedic et al. |
| 6,522,176 | B1 | | 2/2003 | Davis |
| 7,026,846 | B1 | | 4/2006 | Huntley, Jr. et al. |
| 7,205,798 | B1 | | 4/2007 | Agarwal et al. |
| 7,302,237 | B2 | | 11/2007 | Jackson et al. |

FOREIGN PATENT DOCUMENTS

| GB | 2333171 A1 | 7/1999 |
| GB | 2333191 A1 | 7/1999 |
| GB | 2335076 A1 | 9/1999 |
| GB | 2335097 A1 | 9/1999 |

OTHER PUBLICATIONS

Fujitsu, "MB86060 16-Bit Interpolating Digital to Analog Converter", Product Flyer, Jun. 2000, pp. 1-44, Version 1.2, Fujitsu Microelectronics Europe GmbH.
Fujitsu, "MB86060 16-Bit Interpolating Digital to Analog Converter", Datasheet, Feb. 2009, pp. 1-6, Version 2.0, Fujitsu Microelectronics Europe GmbH.
Analog Devices, Inc., "Fundamentals of Direct Digital Synthesis (DDS)", MT-085 Tutorial, 2009, pp. 1-9, Rev. 0, 10/08, WK.
John Vanderkooy and Stanley P. Lipshitz, "Resolution Below the Significant Bit in Digital Systems with Dither", Mar. 1984, pp. 106-113, vol. 32, No. 3, J. Audio Eng. Soc.
"A Technical Tutorial on Digital Signal Synthesis", p. 93, Analog Devices, Inc. 1994.
Maloberti, "Data Converters", pp. 94-97, pp. 50-56, Springer, 2007.

* cited by examiner

*Primary Examiner* — Jean B Jeanglaude

(57) ABSTRACT

In an RF source, a digital waveform synthesizer comprises a computational module to synchronously determine a desired periodic function, $f(\theta)$, within a first bandwidth portion, to which computational result there is combined an injected digital noise increment in an adjustable range of bounded amplitude, specifically selected to average over discontinuities of the DAC transfer characteristic. The combination is effected after passing the injected noise increment through a programmable digital filter forming a composite tuning word having a total bandwidth at a selected Nyquist zone and thence passing the composite tuning word through a truncation component to a DAC. The programmable digital filter is constructed to displace the spectral distribution of the injected noise increment to a portion of the total bandwidth remote from the first bandwidth portion.

4 Claims, 10 Drawing Sheets

DIGITAL WAVEFORM SYNTHESIZER FOR NMR PHASE CONTROL

FIELD OF THE INVENTION

The present work is directed in general to securing an improved RF phase control via digital waveform synthesis and relates particularly to nuclear magnetic resonance apparatus.

BACKGROUND OF THE INVENTION

In modern NMR instruments, nuclear spins are choreographed through application of RF pulses characterized by precision frequency, amplitude, phase, and inter-pulse delay interval as orchestrated by the pulse programmer, a functional block of software and communicating hardware. NMR measurement techniques are effectuated by RF pulse sequences, including sequences wherein the RF phase may be offset in different pulses. Successive pulses are specified in phase and duration with precise inter-pulse delays. Control of RF phase is achieved in one representative example of prior art as shown in FIG. 1 wherein the four phases of a period of a square wave are selectable from quadrant selector 110 from four sub-clocks 101-104, which track a master clock 100. Three DACs are required: DAC 112 having a 2 bit range, defines the quadrant, and the two DACs 114 and 116 (each typically 13 or 14 bit range), establish the vector component magnitudes in the selected quadrant. The vector sum of the outputs of DACs 114 and 116 is obtained with hybrid splitter 117 and combiners 118a, 118b and 118c to obtain the synthesized waveform. The multiple DACS of this phase synthesizer are burdensome for the assembly process, requiring careful attention to matching of correlative DACs. A transient problem may be encountered across the quadrant boundaries where phase transition continuity between quadrants is limited by the finite width phase step. Phase selective apparatus of this type has been incorporated in NMR apparatus supplied by Varian, Inc., Palo Alto, Calif. Prior art of the genre of FIG. 1 contains a multiplicity of components grouped to execute the functions of quadrant selection and RF amplitude selection within the selected quadrant.

In recent years, direct digital synthesis (DDR) has matured as a means for producing a desired analog waveform from a digital representation presented in the form of a sequence of digital words representing frequency, amplitude and phase information ("tuning words") in accurate timed relationship as defined by a precise system clock. A central component for DDR apparatus is the digital to analog converter (DAC) which accepts a digital input and produces analog output. The quantization characteristic of the digital representation and the intrinsic nature of the input circuits will be reflected in the analog output without remediation of these patterns.

Physically recurrent waveforms are properly identified with a phase variable. The tuning word sequence should be regarded as containing sufficient information to fully describe amplitude, phase and spectral properties of the recurring periodic function. Discrete selection of the value of the phase variable is employed in NMR for a variety of purposes, such as detailed examination of intra-molecular couplings, as well as for the gross cancellation of phase dependent artifact in cyclic acquisitions. Phase has physical presence in NMR phenomena through the precession of nuclear spins about the polarizing (z direction) magnetic field. When a nuclear spin is tipped, e.g., the spin projection on the x-y plane is established, and the precessing component in the x-y (transverse) plane defines instantaneous phase in terms of a spatial coordinate.

The NMR apparatus independently establishes a reference phase within the instrument in order that the manipulation of nuclear spins may be selected accurately with respect to the reference phase. Phase selection (or synthesis) defines a modulation envelope of selected duration and phase for the resonant RF pulse applied to a sample under study via NMR.

Direct digitally synthesized waveforms are now common in many digitally based instruments. Such synthesized waveforms are subject to anomalies such as phase errors, amplitude errors, and spurious frequency components. Errors originate from integral and differential non-linearities associated with digital to analog conversion (DAC) apparatus, and separately as an artifact of quantization. Rise and fall time, jitter and the like may contribute as well to undesirable performance. A contributing source of the quantization artifact derives from truncation of a mathematical element to accommodate the width of the tuning word as supplied to the DAC. The DAC itself contributes to a quantization error, because of its finite digital width, thereby constraining the dynamic range and precision of converted information. Discontinuities arising from the quantized signal, as processed by the digital-to-analog conversion are an obvious source of anomalous fourier components. It is known in the art to substantially ameliorate the latter in conversion from digital to analog representation by injecting a controlled amplitude increment of noise into the digital representation. This noise is typically of the order of the amplitude of the least significant bit (lsb) of the DAC. The practice is known as "dither" and can be generalized as an act of first perturbing a precise signal, followed by an averaging (or equivalent) operation on the now perturbed signal. The practice is discussed by many authorities, representative of which is the review of Vanderkooy and Lipshitz, J. (Audio Eng. Soc., v.32, No.3, 1984). It is known in prior art to combine noise perturbation, e.g., dither, with the phase angle coordinate, $\theta$, or the function, $f(\theta)$. One specific example of prior art is suggested in "A Technical Tutorial on Digital Signal Synthesis", p.93, (Analog Devices, Inc, 1994). In that reference, the noise increment is combined specifically with the phase coordinate. Limitation of injected noise to the phase coordinate is recognized in the present work to (theoretically) preserve the maximum dynamic range of the DAC when injected noise becomes appreciable, e.g., significantly larger than the least significant bit unit. Injection of non-band limited noise into the phase angle coordinate at increasing levels beyond the lsb unit of magnitude results in increasing noise in the recurrent (converted) waveform.

It should be observed that prior art has consistently emphasized amplitude fidelity in the synthesized signal with respect to the digital representation of the waveform. The phrase "phase synthesis" in the present work is intended to refer to the selection of an initial phase angle $\theta_0$ together with the evolving variable $\theta_j$, (phase angle) continuing over the duration of an RF pulse derived from gating of the converted wave train.

It is known in other prior art to interpose a high pass filter between a noise generator and a tuning word (of the signal to be synthesized) in order to provide a source of filtered dither for DAC precision enhancement while minimizing the effect of introduced noise in the passband of the converted analog signal. The dither is further provided with means for noise amplitude adjustment to average over discontinuities introduced into the DAC transfer function in order to maintain linearity within specified limits. The provision therein for noise amplitude adjustment over an interval of at least as much as 23328 bits of an (effective) 16 bit DAC. Such maximum achievable dither amplitude is far in excess of the averaging interval required for the purpose of ameliorating intentionally introduced transfer function discontinuities. See Data Sheet, MB86060, 16 Bit Interpolating Digital to Analog Converter, Fujitsu Microelectronics. As a result of the choice of filtering in this particular prior art, the signal is restricted to the first Nyquist zone. The present work employs a more flexible digital filter to permit operation to occur in a selected, higher Nyquist zone. Consequently, a requirement for up-conversion of a first Nyquist zone filtered signal is obviated with clear savings in components.

In another specific instance of a dither enhanced DAC, it has been desired to remove the effect of the added noise in the DAC output through the artifice of a cancellation procedure. The digital signal (comprising a sequence of tuning words) is concurrently applied to one input of each of two combiners. A second input of each of the combiners receives the injected noise as a random or pseudo-random word which is presented in opposite sign to the respective combiners. Each combiner output communicates with a respective DAC and the analog outputs of the respective DACs are again combined to effect cancellation of noise artifact in these two sub-channels (U.S. Pat. No. 6,522,176). While this represents a technically elegant approach, it is apparent that the plurality of DACs increases the cost of production, not only in the cost of the second DAC, but also in the requirement for stable identical fidelity of the DACs to a common specification. Any departure from identical conversion performance simply introduces additional noise to the analog signal following the conversion operation.

SUMMARY OF THE INVENTION

In one aspect of the present work, it is recognized that the fidelity of the DAC output (an amplitude, $f(\theta)$) to the prescribed digital tuning word sequence may be employed to obtain the improved accuracy in phase synthesis requirements of NMR pulses.

A waveform $f(\theta)$ is digitally represented in phase, amplitude, and frequency by a temporal sequence of tuning words. The tuning words may be computed on-the-fly, obtained from a table lookup, derived from an accumulative process, or some other procedure. The temporal sequence is initiated by a selected value of $\theta=\theta_0$ and this (initially selected) value determines the reference phase for that RF wave train. For the present discussion, consider a "re-occurring waveform" to be a selected periodic waveform shape that re-occurs at a selected frequency. The waveform is most usually a sinusoid. The sequence is recurrently presented in clocked synchrony to a DAC for conversion to an analog waveform, in whole or in part. The phase, amplitude and frequency properties of the DAC output is improved by combining a selected digital noise component with the tuning word(s). In the present work, a random or pseudo-random digital noise (dither) generator output is passed through a digital filter of suitable properties. In the present work, a programmable digital filter, preferably a finite impulse response filter (FIR), designed to tailor the frequency spectrum of the noise to desired properties. No limitation to a particular digital filter architecture is implied, although FIR filtering is referenced for convenience and corresponds to experimental activity reported herein. In this work, random and pseudo-random noise will not be distinguished. A preferred such noise spectrum is notched or otherwise designed to accommodate a substantially dither free region corresponding to a pass-band containing the synthesized signal defined by the tuning word sequence. The programmable digital filter has the capability of placing the passband in a selected Nyquist zone. The digitally filtered noise, of bounded amplitude, is then presented to one input of a combiner, the other input of which receives, preferably, the tuning word phase angle component of the desired digital (waveform) representation. The resulting output of the combiner is directed through a truncator or round-off device to yield a tuning word appropriate to the DAC address width. Subsequently the DAC is clocked to yield the corresponding portion of the desired waveform. The incremental noise, or dither, provides the enhanced DAC performance in known fashion, but without degradation of the analog signal-to-noise ratio (SNR) in the pass-band, which may occupy the selected Nyquist zone. The digital filter is characterized by the criterion of noise attenuation in the passband and such noise remaining in the pass-band is best defined as small in comparison with the voltage increment represented by the least significant bit of the DAC. The digital filter also displaces the spectral maximum of the injected noise to a desired spectral region.

In the NMR context, the converted waveform, recurrently presented, is amplified and gated at a precise time, at selected phase and frequency to an NMR probe for irradiation of a sample.

Employment of a single DAC for digital waveform synthesis obviates the problems of multiple DACs, such as component matching and expense. The variably selected noise range allows the phase synthesizer and digital to analog conversion apparatus, in general, to meet a fixed specification by accommodating variations in DAC components. It has been found that to secure improvements in phase error with currently available DACs, the average noise amplitude injected through the FIR filter may be surprisingly large in comparison with the amplitude increment represented by the least significant bit of the DAC. The injected noise, having been displaced by the FIR filter from the pass-band containing the converted waveform, contributes no deleterious effect, particularly for re-occurring periodic waveforms in operation at a selected recurrence frequency. Modeling experiments demonstrate that performance enhancement of digital waveform synthesis is achieved as a matter of reduction of both average phase error and average amplitude error as compared either to prior art or to an ideal DAC.

DETAILED DESCRIPTION OF THE INVENTION

In the present work, the terminology "direct digital synthesis" and "digital waveform synthesis" are not intended to convey separate meaning. Throughout this work reference to "phase" should be considered in context. Those of skill in the art recognize a dual meaning. A periodic (or simply recurrent) function is understood to have general functional relation to an independent variable ($\theta+\omega t$) where $\theta$ is the instantaneous "phase angle" and wt is an additive phase constant. The phase angle ranges between $\theta_0$ and $2\pi+\theta_0$. In the present work the initial value of the phase angle, $\theta_0$, for a particular RF wave train (or pulse), determines what is commonly called the "phase" of that wave train compared to another such wave train (or pulse) derived from the same clock. This traditional parametrization of a wave train has physical meaning in relationship to another such wave train. For specificity the term "phase change" refers to the difference of this parameter between different wave trains. An RF pulse is a modulated portion of an RF wave train and may be derived from a simple gating operation, or from a shaping procedure.

Figure 1:
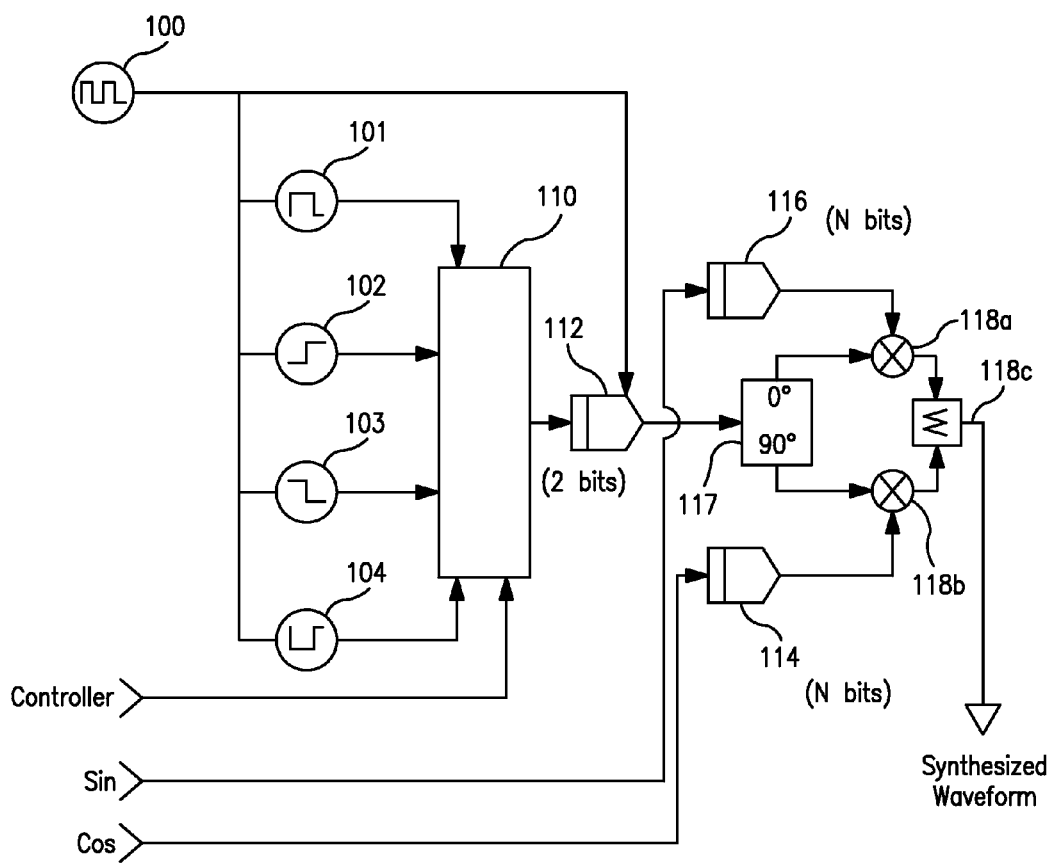
FIG. 1 is a schematic of one exemplar of prior art phase synthesis.
Figure 2A:
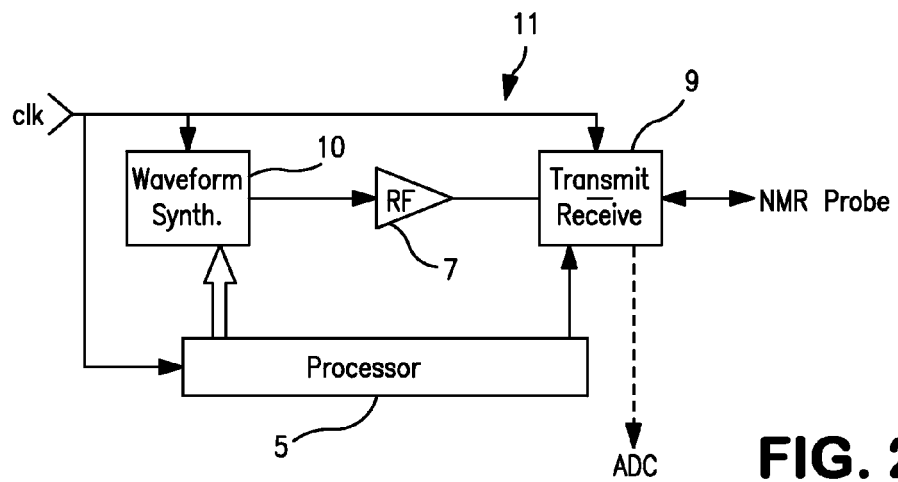
FIG. 2a represents a schematic partial block diagram of an RF source for NMR purposes.

NMR systems are now well known. In such a system a polarizing magnet induces precession of nuclear spins in a sample, at the Larmor frequency determined by the strength of the polarizing field and the nuclear magnetic moment of the spins under study. An RF magnetic field at the Larmor frequency, oriented at some angle to the polarizing field (most often, 90°), will act resonantly upon the spins of interest. The RF energy is derived from an RF source 11 depicted in FIG. 2a to include a digital waveform synthesizer 10, the output of which may be subject to frequency modification and then directed to an RF power amplifier 7. Optionally, a frequency selective component (not shown) is employed to transform the DAC output to a selected frequency as may be required for NMR excitation of different nuclear spins. The RF power is gated on/off in conjunction with a receive/transmit switch 9 and thence directed to an NMR probe, not shown. The gating and receive/transmit functions, directing signals from the NMR probe to an ADC, are not essential to the present discussion. A control processor 5 instructs and monitors operations in cooperation with a system clock signal comprising a precise time base.

Figure 2B:
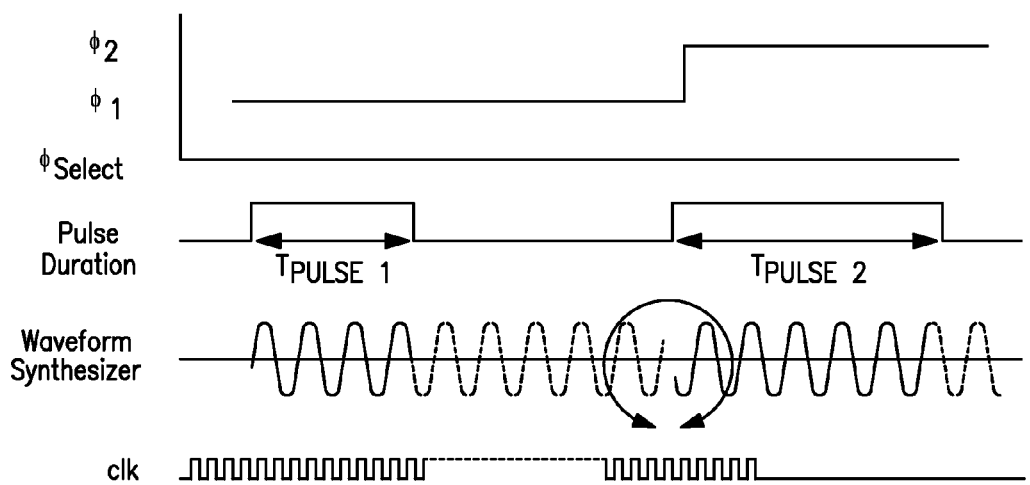
FIG. 2b is a simple timing diagram representative of the present work.
Figure 2C:
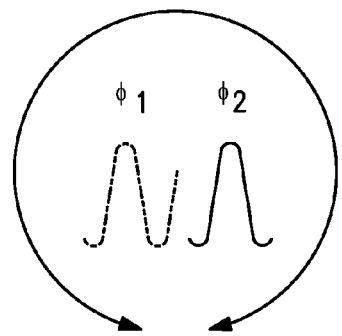
FIG. 2c details the specific function of phase selection.

The timing relationships of these components is illustrated in FIG. 2b. In operation, a selected initial phase angle $\theta_0$, is specified from processor 5 to waveform synthesizer 10 which responds by initiating the selected (usually sinusoidal) waveform synthesis at the selected initial phase angle. The receive/transmit/gate 9 functions to direct the RF power of selected phase $\Phi_1$ to the NMR probe for a selected duration. At a subsequent point in the course of a pulse sequence, the phase selection is activated to select phase $\Phi_2$ and the result is emphasized in the detail of FIG. 2c. There, a phase change is apparent, resulting from selection of a different reference phase. The phase change over the preceding RF pulse (represented in the dotted line), serves to emphasize the phase selection function. It is the value of the selected phase change in respect to a reference phase, that is desired for specification of the next pulse within the pulse sequence to achieve the desired phase change. It is apparent that the gating function is not independent of the initiation of the RF wave train. The phase change characterizing the relationship of successive pulses (of respective durations $T_{pulse\ 1}$ and $T_{pulse\ 2}$) is analogous to the selection of initial phase angles of the corresponding wave trains. For expository purposes, the phase angle at which the gate becomes active may be considered identical to the initial phase angle for synthesis of the relevant wave train. It is clear that a precise delay might be interposed to allow for any transient behavior prior to activating the gate function.

Figure 3A:
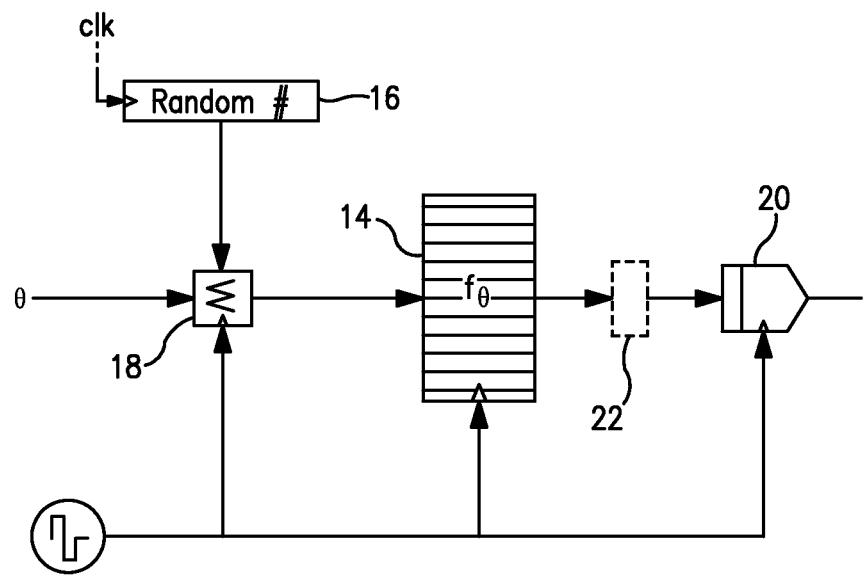
FIG. 3a is a schematic block diagram of a basic dither enhanced digital waveform synthesizer.

A representation of a basic dither enhanced waveform processor derived from a prior art DAC is shown in FIG. 3a. From this point, "prior art" refers to direct digital waveform synthesis. With due consideration that the present work is primarily directed to improved phase synthesis and control, it is useful to examine the digital waveform synthesis aspects of the present work as against the prior art, also in respect of amplitude and frequency response. FIG. 3a represents the teaching (of one exemplar of prior art) regarding the desirability of injecting an incremental noise component to a DAC input for enhanced performance through dithered averaging over phase discontinuities resulting from the quantization of the conversion function. This phase noise approach is summarized as injection of dither prior to the angle-to-amplitude conversion. Distinct limitations are found in the injection of dither as amplitude noise and as phase noise. However, all prior art known to the present author emphasized the enhancement to be obtained through dither, in enhancement of DAC resolution, e.g., amplitude response. The components of FIG. 3a, that are common with components of FIG. 3b, bear the identical labels.

Figure 3B:
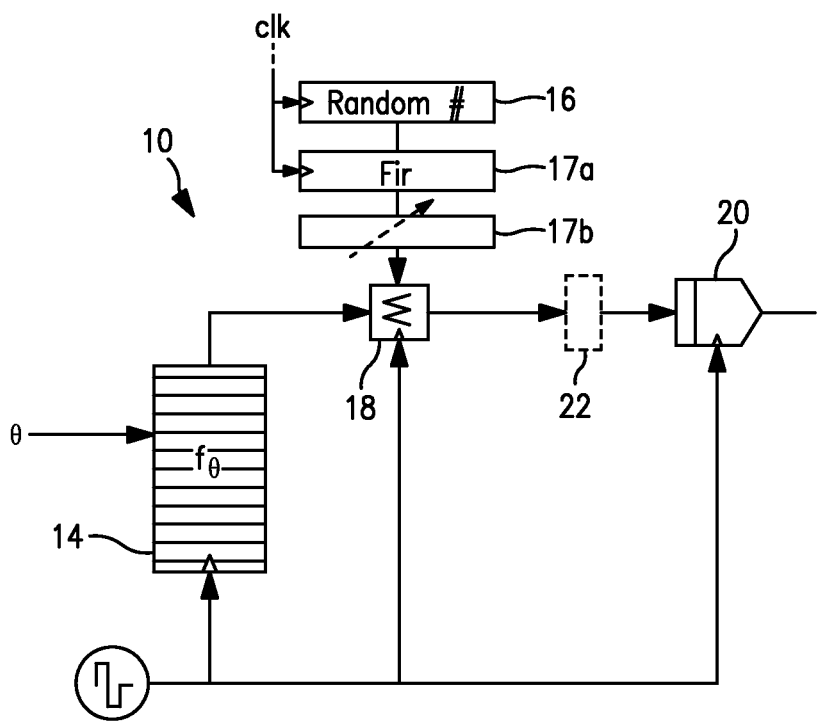
FIG. 3b is the phase synthesizer of the present work.

FIG. 3b is a simple representation of the dither enhanced digital waveform synthesizer 10 of this work. From an argument $A_i$ (or a sequence of values for i=i+1, i+2, ...), a digital representation 14 defines a resultant value or function $f(\theta)$ as a sequence of digital tuning words. The definition may take the form of a tabular look-up, an accumulator, or a calculation on the fly of the tuning words for the desired periodic function, as for example, a sine. The digital representation 14 may exploit symmetries of the function to reduce the necessary capacity of the computational module 14, as for example, by operating upon half wave or quarter wave of sines or cosines with appropriate algebraic signs. Phase is selected by presentation to the digital representation 14 of an initial value $\theta_0$ for the phase angle variable $\theta$. This initiation step determines the selected initial tuning word of the sequence, and thus, phase is selected without physical reference to an arbitrary reference phase, such as $\theta=0$. Waveform synthesis continues as each corresponding tuning word of the sequence is clocked to one input of combiner 18. A digital random (or pseudo-random) number generator 16 passes a (bounded) random datum through a finite impulse response (FIR) filter 17a to a second input of combiner 18. An optional amplitude selection module 17b is usefully employed to select an optimum scaling factor for the random datum. The relationship of the random datum with the tuning word is discussed below, but may be regarded as an increment/decrement to the tuning word resulting in a noise perturbed tuning word. The output of combiner 18 is clocked to the DAC 20 through an optional rounding or truncation component 22 for assuring the combiner output, or DAC input word $B_0$, does not exceed the digital range of the DAC. Operating upon the noise perturbed tuning word sequence, the DAC produces analog output containing frequency components which are spectrally localized to a selected Nyquist zone. The FIR filter 17a (or other digital filter) is constructed to displace the spectral distribution(s) of the perturbing noise from the pass-band containing the bandwidth of the tuning word sequence. A low pass, high pass or notch structure may be satisfactory, so long as the FIR filter 17a localizes the spectral components of the incremental noise, or dither, to avoid overlap with the bandwidth of the digital signal, i.e., the tuning word sequence. A broad band pass filter is preferred for the FIR filter 17a with rejection such that the noise fully attenuated over the spectrum utilized by the tuning word sequence. Prior art typically places an analog bandpass filter on the DAC output to pass the desired from the tuning word sequence while attenuating undesired harmonics, sub-harmonics and out of band added noise.

It is apparent that as to the enhanced digital waveform synthesizer of the present work, one distinction with the prior art of FIG. 3a lay in the interposition of an (appropriate) FIR filter between the random word source and the DAC input. For the present work the appropriate FIR filter is designed to displace the noise derived from the random word source to a frequency region that does not overlap the bandwidth of the unperturbed tuning word sequence. The noise rejection of the filter in the region occupied by the desired tuning word sequence is sufficient such that the resulting noise density is less than 1 lsb of the DAC.

The analog signal that is obtained at the DAC output will depart from the digital representation of the desired signal due to a number of errors. The initial RF phase is to be selected with the greatest achievable accuracy. Such accuracy may be limited by quantization intrinsic to the computation or table look-up at discrete values of phase angle, $\theta_i$ and by the resolution of the DAC as measured by units of the least significant bit (lsb) of the DAC characterized by N bits, a unit here designated $B_{lsb}$. The DAC may also be subject to static error, both differential and integral non-linearities, respectively $D_{nl}$ and $I_{nl}$, where these error quantities are specified as peak-to-peak and possibly other dynamic error (finite rise and fall time). Differential non-linearity in the DAC originates in a finite departure from constant width of voltage output increments $\Delta V$ for constant corresponding digital increments, e.g. lsb. This error accumulates and appears as integral nonlinearity. DAC manufacturers typically remedy this error through a "re-alignment" of the transfer characteristic of the device at intervals over the range of the device. These practices are explained by Maloberti ("Data Converters", pp. 94-97; pp. 50-56, Springer, 2007). The presence of these re-alignments may be directly observed by linearly sweeping a physical DAC over its full range and observing the resulting output at sufficient resolution such that sub-lsb errors may be discerned. That observed linear sweep will then exhibit a regular incidence of discontinuities in the ordinate, at points of realignment, with constant slope of the sweep. In this work, a practical DAC is regarded as having a range 0 to $2^N-1$ defined by N bits, a sampling frequency of $\omega_{clk}$, an output frequency of $\omega_{DAC}$, and a number of P calibration realignment points (substantially) uniformly distributed over the dynamic range of the DAC. These P discontinuities of the transfer characteristic of a DAC are regarded as a property of the DAC for the purposes of this work. It follows that the interval between discontinuities is about $2^N/(P-1)$.

It is convenient to first examine an ideal DAC, free of dynamic error. This model provides a convenient and practical standard for comparison of the present work. For the ideal DAC, response time is instantaneous, and the transfer function is free of non-linearities. A purely computational error is associated with the finite number of bits $A_i$ available for specification of the argument of the function and the number of resultant bits $B_i$, available to specify the resulting computation of the function (sinusoid). The computed function is necessarily normalized to the finite field of the DAC, that is the number of bits $B_o$, ordinarily taken as the number of DAC bits. The peak quantization error M, of computational origin, can be stated in lsb units of the DAC as $$M = \left(\frac{2^{B_i}}{2^{A_i}} * \frac{\pi}{2} + \frac{1}{2}\right)\frac{2^{B_0}}{2^{B_i}} \qquad \text{equ. 1}$$

For example, consider a sinusoid argument (0 to $2\pi$) specified to A=19 bits and computed function result over the range −1 to +1 specified to B=14 bits:

M=±0.11 lsb units for a DAC of N=14.

The aggregate of computational and static DAC error forms an expression suitable to a realistic (e.g., physical) DAC, where the error may be expressed in units of least significant bit having an effective magnitude of $$\text{lsb}_{\it{eff}}=1+M+\text{INL}_{pp}+\text{DNL}_{pp} \qquad \text{equ. 2}$$

where $\text{INL}_{pp}+\text{DNL}_{pp}$ represent the peak to peak magnitudes of integral and dynamic nonlinearities for the particular DAC and M is the peak quantization error given above. In the context of a DAC having N bit resolution and operating at clock frequency $\omega_{clk}$, and presenting a converted waveform at frequency $\omega_0$, it can be shown that the expected peak phase angle error, $\delta\theta_i$ in the ideal DAC output waveform is expressed in units of least significant bits of the DAC, $B_{lsb}$, as $$\delta\theta_i = \frac{180}{\pi} * \sqrt{\frac{2\omega_0}{\omega_{clk}}} * \text{ATAN}\left(\frac{1+1\text{lsb}_{\it{eff}}}{2^{N-1}}\right) \qquad \text{equ. 3}$$

In the course of the present work, it has been found that this particular expected maximum phase angle error is reduced in proportion to the inverse of the square root of the pulse duration, e.g., the modulation envelope of the RF radiation employed for NMR sample spin manipulation.

$$\delta\theta_i = \frac{180}{\pi} * \sqrt{\frac{2\omega_0}{\omega_{clk}}} * \sqrt{\frac{T_0}{T_{pulse}}} * \sqrt{\text{ATAN}\left(\frac{1+1\text{lsb}_{\it{eff}}}{2^{N+1}}\right)} \qquad \text{equ. 4}$$

where $T_0$ is the period associated with the fundamental output frequency of the DAC and $T_{pulse}$ is the pulse duration. If dynamic errors such as rise/fall time are not significant, the worst case peak (relative) phase error is obtained when the numerator of the argument of the arctangent is replaced by the "effective" least significant bit magnitude $\text{lsb}_{\it{eff}}$(equ. 2). The lengthier pulse affords a greater averaging effect for reduction of relative phase error.

Phase angle error has been discussed in the context of the independent coordinate of the periodic function defining a single wave train, or pulse. The demands of precision NMR, utilizing pulse sequences, is often directed to the phase change between successive pulses. Therefore the peak phase error between separate pulses, as phase controlled through the present work, may be taken as about twice the phase angle error internal to a single wave train.

In order to quantify the results of the present work, phase angle error is evaluated for a digital waveform synthesizer involving an ideal DAC, as well as for a realistic physical DAC. The operational performance of an ideal DAC is derived from model calculation and provides better appreciation for the quantization error characterizing a DAC that is free of integral and differential non-linearities. Consider an assumed 14 bit ideal DAC operating at an output frequency of 25 MHz, with a clock rate of 200 MHz. "Ideal" is taken to mean perfect differential linearity over the range of the DAC. As normalized to the 14 bit DAC, the least significant bit is taken as arising from a phase angle argument specified to 19 bits and a computed result of 17*a* bits, presenting an average amplitude error of 0.11 (lsb of 14 bit DAC). The corresponding peak phase angle error of the desired signal is ±3.88 mdegree. The amplitude error is shown to be ±65 ppm.

Next, a simple phase synthesizer, differing from FIG. 3*b* only by the absence of random number generator 16 and FIR filter 17*a*, and implemented with a model of a real 14 bit DAC having integral and differential non-linearities typical of AD9744 (Analog Devices, Norwood, Mass.) as operated to compare the phase angles observed through a vector signal analyzer with the numeric argument(s) presented to the computational module 14 and an average of the discrepancies are obtained, yielding a measured peak phase angle error of ±8.9 mdegree and a peak amplitude error of ±122 ppm.

Finally, the system of FIG. 3*b* is directly measured in similar fashion with introduction of noise of bounded amplitude in the range of 9 to 10 lsb units, as a known technique for averaging over DAC realignment discontinuities. The measured peak phase angle error in this instance is found to be ±3.4 mdeg, thereby showing a 10% better performance than that expected from the ideal 14 bit DAC and an amplitude error of ±87 ppm which is better than the phase synthesizer lacking FIR filtered random number injection, and approximately as well as may be achieved from an ideal DAC. This surprising result has been further investigated as set forth below. The present work is tolerant of high amplitude noise injection because the programmable digital filter displaces this noise away from the passband and may be used to transfer operational function to a higher Nyquist zone. It should be pointed out that a DAC may be used to generate tones in higher Nyquist zones and use of a programmable filter is consistent and allows for the DAC operation in such alternative Nyquist zones.

It has been remarked above that bounded noise or dither of the order of 1 lsb has been employed in prior art to enhance DAC performance. In the present work it has been found that error in internal phase for the above described apparatus is found to decrease for average injected noise amplitude that may reach 9 to 10 times the amplitude associated with one lsb of the DAC studied. This result has been examined in simulation studies where standard production DAC specifications have been modeled for detailed study of this result. (Here it is again noted that a prior art DAC mentioned above (Fujitsu), included a noise generator for dither with dynamic adjustable range of 23328 lsb units of noise amplitude.) This effect is particularly relevant to the case of a recurrent signal where the recurrence frequency of a waveform is harmonically related to the DAC clock frequency. In that case the same bits of the DAC are active on the corresponding portion of the waveform in recurrence. In a real DAC the voltage increments defined by the bits of the DAC vary slightly and it is the practice of the DAC manufacturer to avoid cumulative departure from linearity by "re-alignment" of the digital transfer characteristic in order to maintain a stated device specification limit over the range of the DAC. Given a number of P realignments, such re-alignments are typically placed at uniform intervals in the range of the DAC as referenced above. Where the DAC clock and recurrence frequency are not harmonically related, such recurrences would allow the waveform to exhibit voltage increments defined by different bits in a manner that would be equivalent to an averaging process as the waveform would drift over the range of the DAC over a number of recurrences. For the harmonic relationship, systematic error resides in discontinuities introduced by the compensatory re-alignments introduced into the DAC. When the amplitude of the injected random noise approaches the amplitude of the departure of the DAC from linearity (discontinuities at compensatory realignments which may span many lsb units), the character (crudely speaking) of the phase angle and amplitude error transitions from systematic to random. Consistent with this observation, the enhancement observed in this specific example for injected noise amplitude in excess of 10 lsb shows diminishing benefit if the noise amplitude is further increased until no further improvement is observed. As a result of this investigation, phase error (for a DAC characterized by parameters N,P) is satisfactorily minimized by perturbation of a periodic signal with uniformly distributed random noise in the bounded amplitude range $$2^{N-log_2 P} < \text{noise amplitude} < 2^{N+1-log_2 P}$$

where P is the number of (substantially) uniformly distributed realignment points over the numeric range of the DAC. Accordingly, in order to optimally ameliorate the introduced re-alignments of the transfer function, it is only necessary to ascertain the spacing of re-alignments to specify a dither amplitude appropriate to the purpose of averaging over such re-alignment intervals. Consequently, the dither amplitude for this purpose can be fixed, and kept to a minimum. Minimization of the dither is favored because the usable full scale of the DAC for the desired signal must be decreased by the amplitude of the dither. Whereas averaging over intervals of realigned transfer characteristic may require some span of noise or dither amplitude to be determined, there is a default to at least 1 lsb unit of dither amplitude for the purpose of resolving the sub-lsb quantities, even in the absence of such re-alignments.

Hypothetically, as the magnitude of differential non-linearity in future DAC components approaches zero (an ideal DAC), the optimal amplitude of injected noise would approach the order of one lsb. However, it remains the case that the present work also demonstrably exceeds the performance of an ideal DAC, as further discussed below.

Figure 4A:
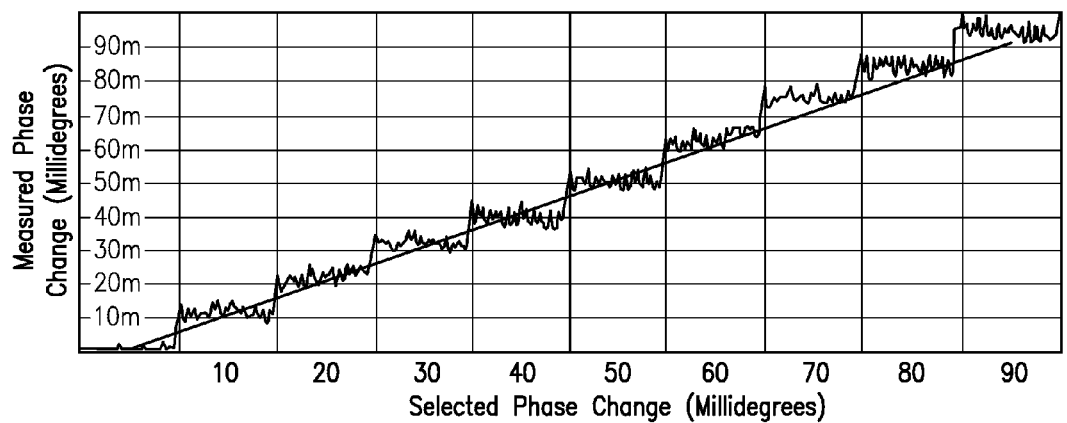
FIG. 4a shows the measured phase error for the apparatus of FIG. 3b.
Figure 4B:
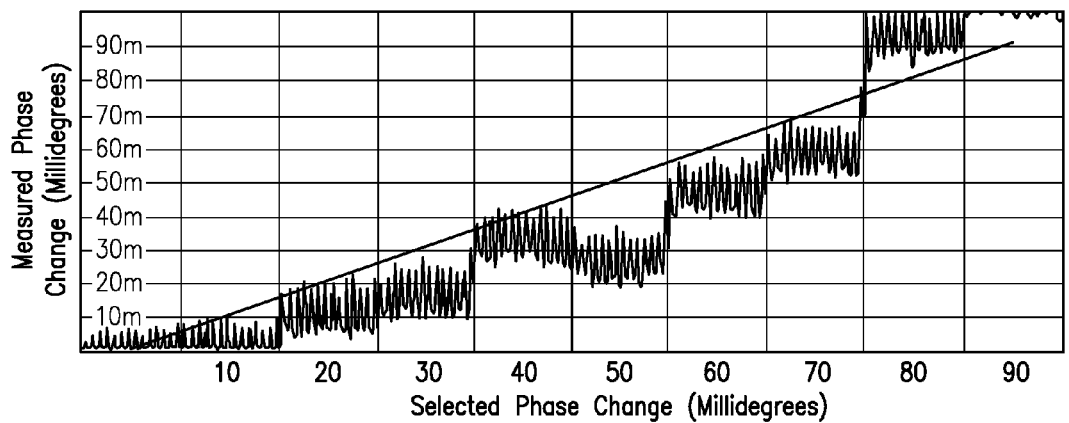
FIG. 4b is the phase error observed for a waveform conversion without injected noise.

FIGS. 4*a* and 4*b* compare the error in phase change for a series of RF pulses observed via vector signal analyzer for, respectively, the digital waveform synthesizer of FIG. 3*b* and a simple direct digital waveform synthesizer comprising the nominally identical DAC with (FIG. 4*a*) and without (FIG. 4*b*) noise enhanced resolution. (This simple arrangement of a DAC, without noise enhancement, provides a convenient standard for comparison). The abscissa contains 10 RF pulses of 5 μsec duration. The first pulse establishes a reference phase (here, 0°). For each successive RF pulse the phase is incremented 10 millidegrees with respect to the prior pulse.

Figure 5A:
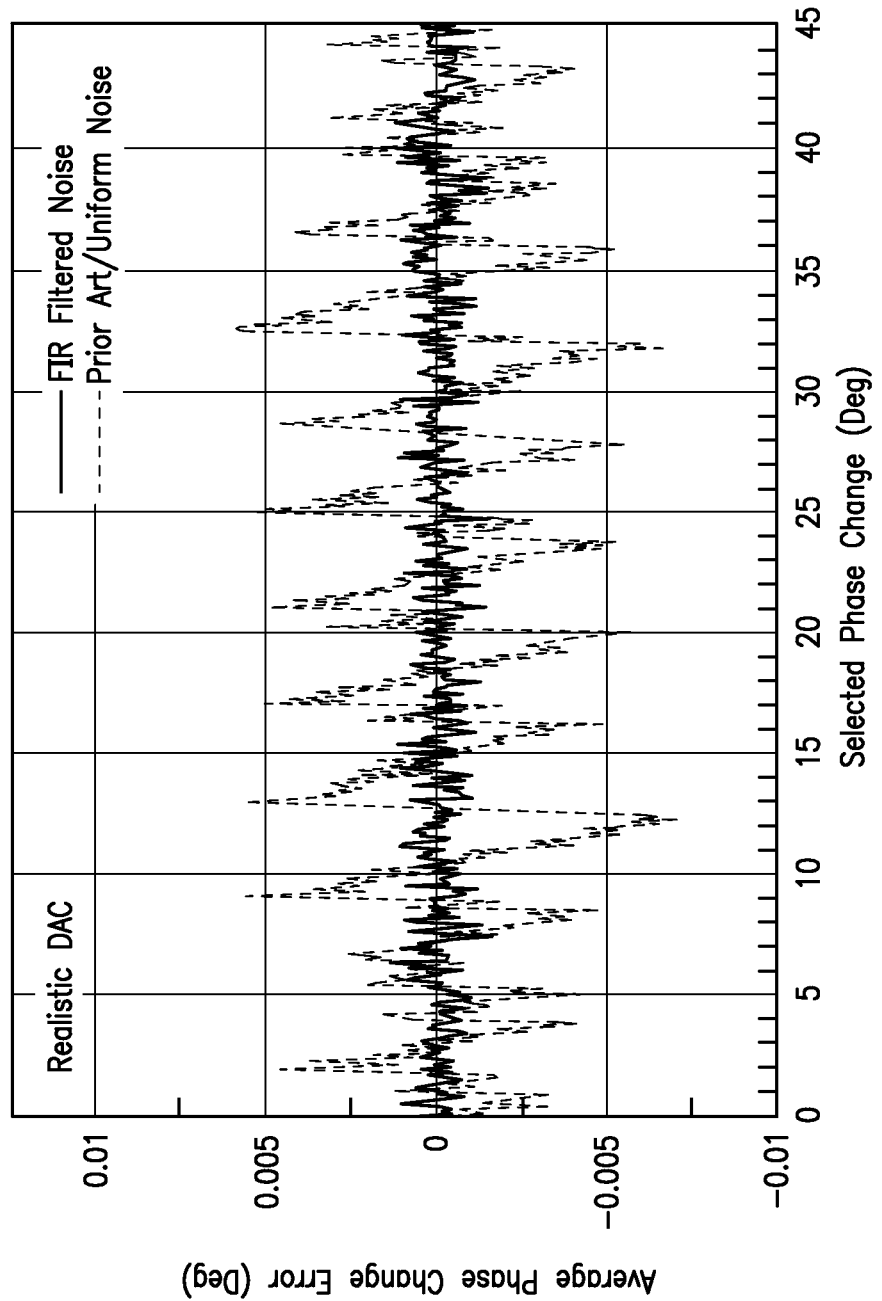
FIG. 5a compares phase error for a realistic DAC of prior art with that of FIG. 3b.

Detailed investigation of the present apparatus is best carried out through a modeling approach, where uncontrollable or parasitic effects are accountable through the model. Accordingly, the elements of the present apparatus are readily represented within the model using parameters derived from specifications available from the DAC manufacturer to define a realistic DAC for modeling purposes, including the realignment intervals. In that manner, the arrangement of FIG. 3*b* may be compared to prior art direct digital waveform synthesis where the latter is merely modeled through omission of the FIR filter 17*a* and noise amplitude scaler 17*b*. FIG. 5*a* illustrates such a comparison for average phase change error as a function of selected phase change, where the result of the present work (comprising a realistic modeled DAC) is represented by the solid line and the prior art (same realistic DAC) is shown in the dotted line. The phase angle error is averaged over the pulse duration (here, $T_0$=2 μseconds).

Figure 5B:
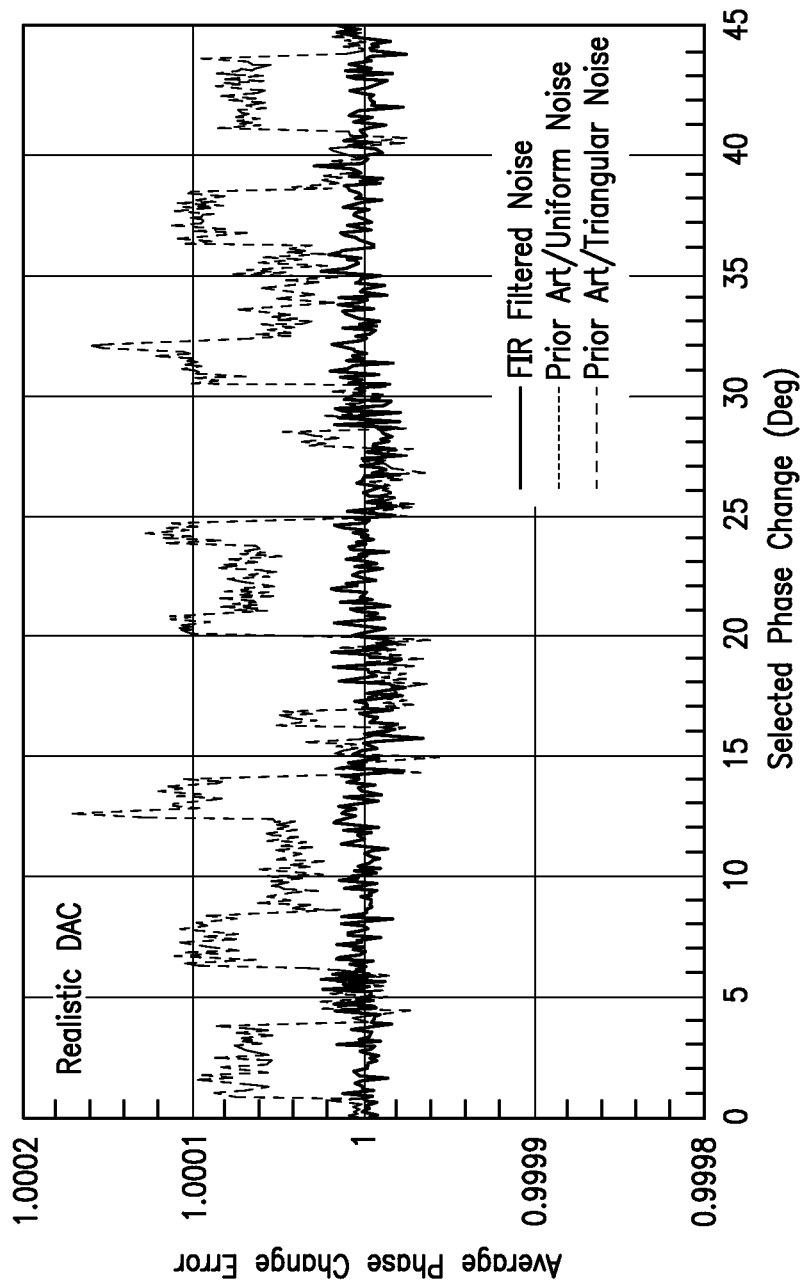
FIG. 5b compares amplitude error for a realistic DAC of prior art with that of FIG. 3b.

The calculation is repeated for values of selected phase change over the range of phase angle $0-\pi/4$. In like manner, the relative amplitude error comparison appears in FIG. 5b. Here again, the relative amplitude error is averaged over $T_{pulse}$ and the calculation repeated for the range of selected phase change. Here again, the realignment points of the DAC are apparent in the oscillatory behaviour of the prior art. For waveform synthesis in NMR apparatus, amplitude error is more easily tolerated because of the waveform shaping contributed by the RF power amplifier. The improvement in the fidelity of the synthesized signal removes a potential limit in the precision of future NMR measurements, particularly those measurements which rely upon phase change sensitive pulse sequences.

Figure 5C:
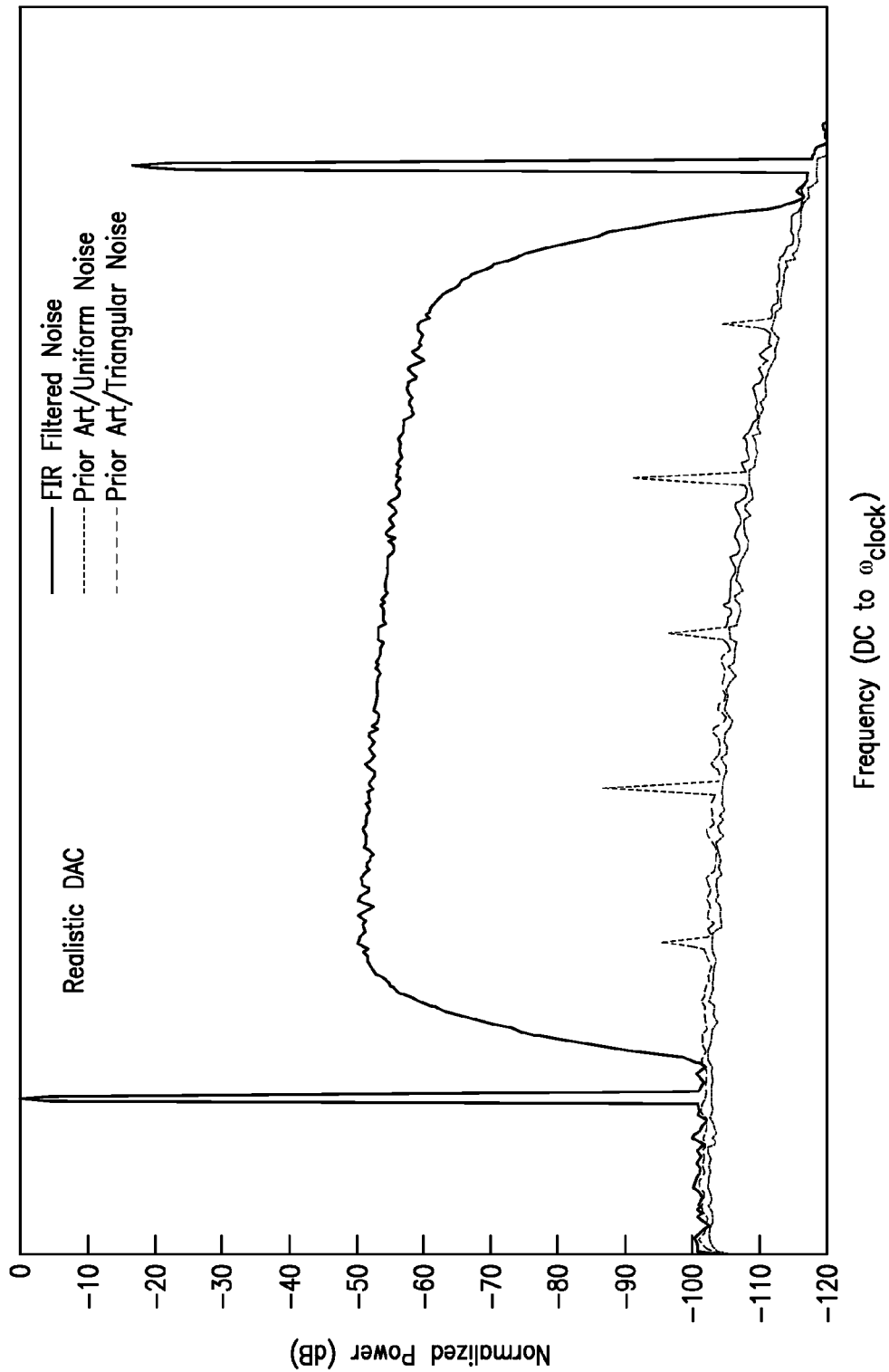
FIG. 5c compares frequency response for a realistic DAC of prior art with that of FIG. 3b.

FIG. 5c compares the frequency response for the present work (solid line) with the realistic modeled prior art. The latter was separately modeled with noise spectral character of uniform noise (dashed line) and with triangular noise (dotted line). Noise in the pass-band for the present work very slightly exceeds that of either type noise for the prior art model. This appears to arise from contributions of mixing of out-of band frequency components. Anomalous peaks for the ideal DAC example correspond to harmonics of the input tuning word sequence signal. This figure is directed to operation within the first Nyquist zone. The utilization of a programmable filter allows selection of a higher Nyquist zone, obviating any requirement for frequency multiplier in the RF source module. FIG. 5c illustrates an example of a filter shaped to pass a spectral region including the lower 25% of the first Nyquist zone and the upper 25% of the second Nyquist zone.

Figure 6A:
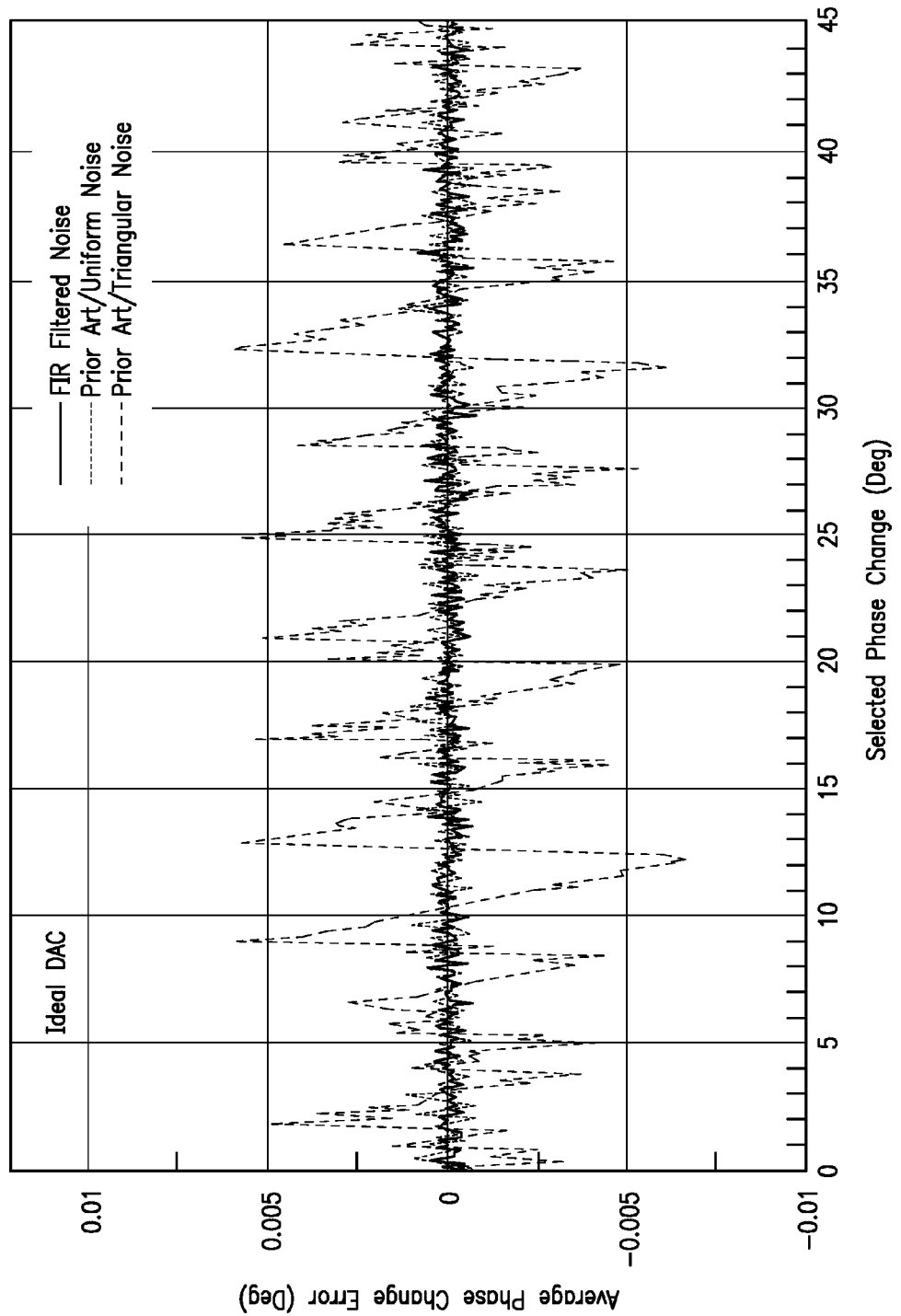
FIG. 6a compares phase error for an ideal DAC with that of FIG. 3b.
Figure 6B:
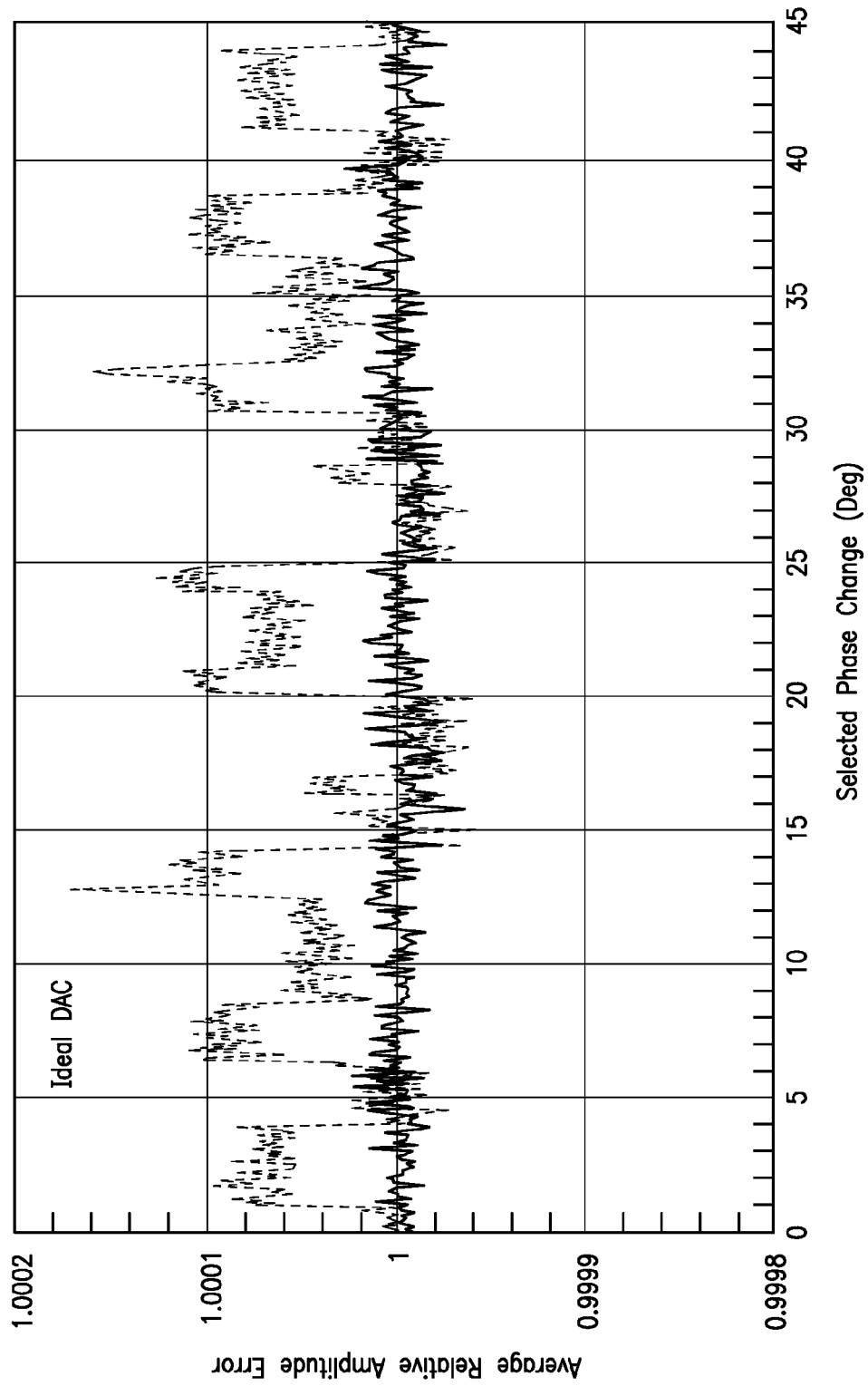
FIG. 6b compares amplitude error for an ideal DAC with that of FIG. 3b.

An ideal DAC furnishes an additional metric for performance comparison. The same (solid line) performance of the present work is compared with prior art (FIG. 3a). FIGS. 6a and 6b show the excursions in both average phase change error and relative amplitude error as compared with the present work. Because the ideal DAC is free of nonlinearities, it is the quantization error alone that is addressed by FIR filtered noise injection of the present work.

Figure 6C:
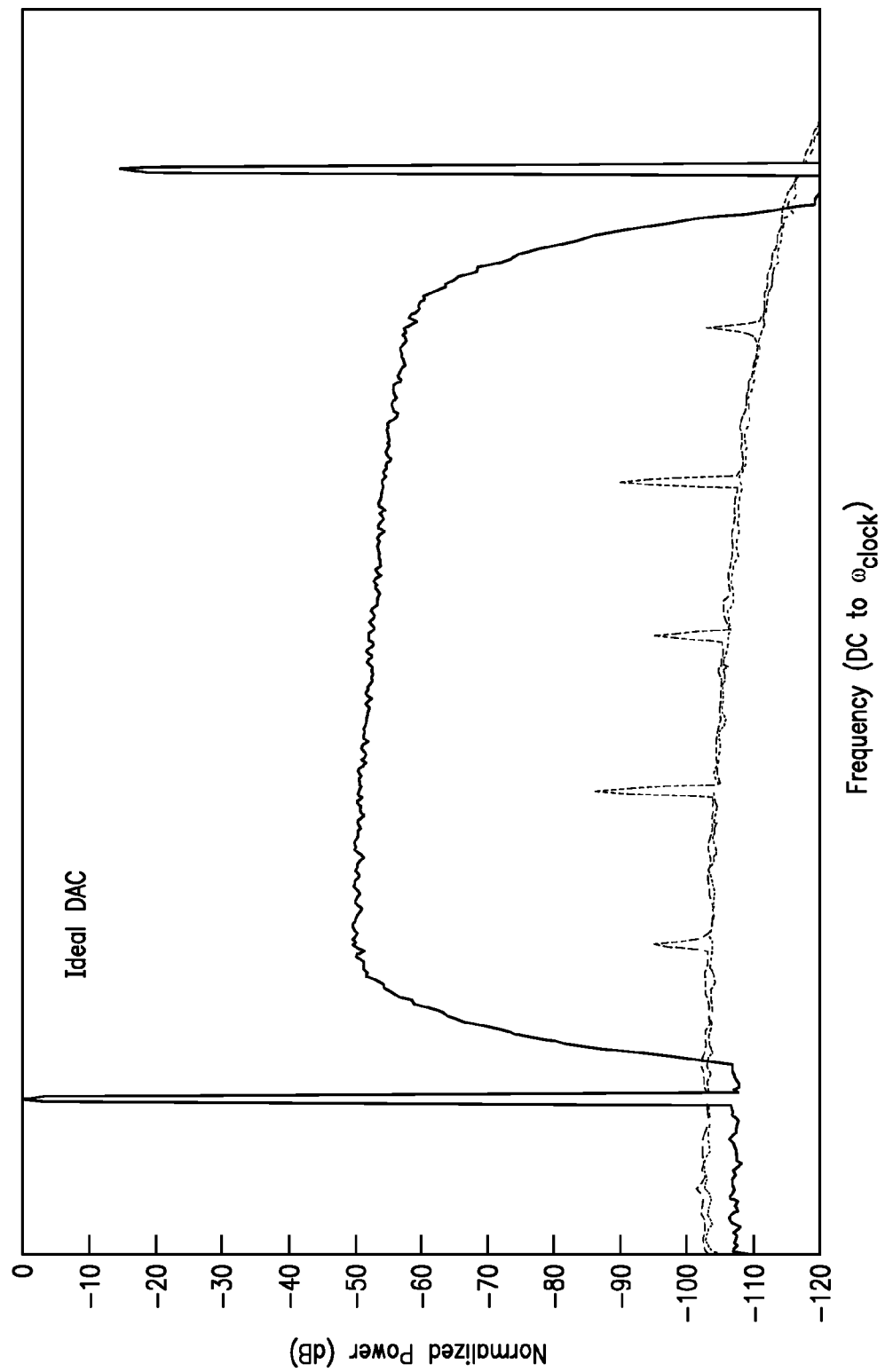
FIG. 6c compares frequency response an ideal DAC with that of FIG. 3b.

The frequency response of the realistic and ideal DAC based models is shown in FIG. 6c. Spectral properties of the noise have been investigated for bounded uniform and triangular noise. The noise floor in the pass-band is significantly greater for the prior art/ideal DAC system.

As known, unusual performance advantages for a DAC comprising N bits can be achieved through addition of incremental digital noise to the digital waveform. The present work eliminates that incremental noise in the passband occupied by that waveform, without analog filtering and with complete flexibility in the selection of the Nyquist zone for operation. The result is a concurrent improvement in accurate phase and amplitude synthesis. Amplitude response is improved, as previously known, through averaging over the quantization interval as achieved with noise injection. In the present work, there results only an insignificant noise floor in the bandwidth of the digital source signal as converted, because the FIR filter displaces such noise outside the pass band while allowing flexible Nyquist zone selection. Such noise as does appear here is a result of out of band mixing.

The present work yields an apparatus wherein performance exceeds the capability of prior art DAC based apparatus through injection of an appropriate amplitude noise component. That the present apparatus exceeds the performance capability of ideal DAC based apparatus is cause for surprise. Here, the real apparatus exceeds the ideal because the ideal component, while free of non-linearities, is subject to the effects of quantization. The present work results in apparatus specifically directed to the problem of quantization as well as to optimally compensating non-linearities of real components.

It will be understood that various details of the invention may be changed without departing from the scope of the invention. Furthermore, the foregoing description is for the purpose of illustration only, and not for the purpose of limitation—the invention being defined by the claims.

What is claimed is:

1. An RF pulse source of selectable RF phase, comprising:
   a clock signal to establish a precise time base;
   a digital representation of a desired waveform, comprising a plurality of digital tuning words defining said waveform, said waveform having phase angle and an amplitude corresponding to the phase angle, said tuning words having portions respectively for representing the amplitude and the phase angle;
   a digital-to-analog converter of accepting a digital amplitude portion and transforming same to an analog representation thereof; and
   a combiner for presenting each digital amplitude portion to the digital-to-analog converter in sequence determined by the phase angle portion, said presentation in timed synchrony with the time base; said digital representation communicating with the combiner to establish the value of phase angle corresponding to the initial tuning word of the sequence, whereby the digital-to-analog converter provides an analog representation of the desired waveform.

2. The RF source of claim 1, wherein the sequence is continuously presented to the digital-to-analog converter and an RF wave train of first selected phase is derived therefrom.

3. The RF source of claim 2, further comprising a gating element to enable said wave train of first selected phase for communication to an external device for a desired time interval.

4. The RF source of claim 3, wherein the selected portion is the amplitude portion of the tuning word.

* * * * *